United States Patent
Park (10) Patent No.: US 8,435,817 B2
(45) Date of Patent: May 7, 2013

(54) METHOD OF MANUFACTURING ORGANIC LIGHT EMITTING DEVICE AND METHOD OF MANUFACTURING ORGANIC LIGHT EMITTING DISPLAY APPARATUS USING THE SAME

(75) Inventor: Jin-Han Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 16 days.

(21) Appl. No.: 13/267,643

(22) Filed: Oct. 6, 2011

(65) Prior Publication Data

US 2012/0100651 A1    Apr. 26, 2012

(30) Foreign Application Priority Data

Oct. 22, 2010  (KR) ................. 10-2010-0103676

(51) Int. Cl.
*H01L 21/00*  (2006.01)
(52) U.S. Cl.
USPC ................................................... 438/34
(58) Field of Classification Search ........... 438/34, 438/46; 257/E51.018
See application file for complete search history.

(56) References Cited

U.S. PATENT DOCUMENTS

| | | | | |
|---|---|---|---|---|
| 7,666,570 B2* | 2/2010 | Noh et al. | ........... | 430/270.1 |
| 7,718,341 B2* | 5/2010 | Noh et al. | ........... | 430/199 |
| 8,324,013 B2* | 12/2012 | Sun et al. | ........... | 438/82 |
| 2006/0046181 A1* | 3/2006 | Kim et al. | ........... | 430/199 |
| 2007/0045540 A1 | 3/2007 | Kang et al. | | |
| 2011/0180203 A1* | 7/2011 | Sun et al. | ........... | 156/247 |

FOREIGN PATENT DOCUMENTS

| | | |
|---|---|---|
| KR | 10-2006-0020049 A | 3/2006 |
| KR | 10-2007-0024824 A | 3/2007 |
| KR | 10-2007-0052136 A | 5/2007 |
| KR | 10-2010-0026248 A | 3/2010 |

\* cited by examiner

*Primary Examiner* — Trung Q Dang (74) *Attorney, Agent, or Firm* — Christie, Parker & Hale, LLP (57) ABSTRACT

A method of manufacturing an organic light emitting device that readily increases the characteristics of an intermediate layer having an organic light emitting layer, and a method of manufacturing an organic light emitting display apparatus. The method of manufacturing an organic light emitting device includes preparing a substrate having a first electrode; disposing the substrate on a base member; disposing a donor film that covers the substrate and contacts the base member exposed around the substrate; combining the base member and the donor film; forming an intermediate layer having an organic light emitting layer on the first electrode by performing a transfer process in a laser thermal transfer apparatus after placing the base member and the donor film combined with each other with the substrate interposed therebetween in the laser thermal transfer apparatus; and forming a second electrode on the intermediate layer.

26 Claims, 10 Drawing Sheets

METHOD OF MANUFACTURING ORGANIC LIGHT EMITTING DEVICE AND METHOD OF MANUFACTURING ORGANIC LIGHT EMITTING DISPLAY APPARATUS USING THE SAME

CROSS-REFERENCE TO RELATED APPLICATION

This application claims priority to and the benefit of Korean Patent Application No. 10-2010-0103676, filed on Oct. 22, 2010, in the Korean Intellectual Property Office, the disclosure of which is incorporated herein in its entirety by reference.

BACKGROUND

1. Field

Embodiments of the present invention relate to a method of manufacturing an organic light emitting device and a method of manufacturing an organic light emitting display apparatus using the same.

2. Description of Related Art

Recently, display apparatuses have been replaced by thin, portable, flat panel display apparatuses. Of the flat panel display apparatuses, organic light emitting display apparatuses have received considerable attention as the next generation flat panel display apparatuses due to their wide viewing angles, high contrasts, and short response times. Organic light emitting display apparatuses also have high brightness and low driving voltage.

An organic light emitting display apparatus includes an organic light emitting device, which includes a cathode electrode, an anode electrode, and an organic light emitting layer. When the organic light emitting device is driven by applying a voltage to the cathode electrode and the anode electrode, visible light is emitted from the organic light emitting layer.

The organic light emitting layer may have two or three colors, and thus, a color display apparatus may be realized. The organic light emitting layer may be formed by using various methods. For instance, it may be formed by using a deposition method or a thermal transfer method, since an organic material cannot be easily wet patterned.

In the thermal transfer method, after preparing a donor film that includes a transfer layer containing an organic material for forming an organic light emitting layer, the organic light emitting layer is formed by applying heat to the donor film. However, prior to a transfer process using heat, it is difficult to precisely handle the donor film and a substrate on which the transfer process is performed using the donor film, and thus, there is a limit in forming an organic light emitting layer having desired characteristics.

SUMMARY

To address the above and/or other problems, aspects of embodiments of the present invention provide a method of manufacturing an organic light emitting device that can readily increase the characteristics of an intermediate layer having an organic light emitting layer, and a method of manufacturing an organic light emitting display apparatus using the same.

According to an embodiment of the present invention, there is provided a method of manufacturing an organic light emitting device, the method including: preparing a substrate having a first electrode; disposing the substrate on a base member; disposing a donor film that covers the substrate and contacts the base member exposed around the substrate; combining the base member and the donor film; forming an intermediate layer having an organic light emitting layer on the first electrode by performing a transfer process in a laser thermal transfer apparatus after placing the base member and the donor film combined with each other with the substrate interposed therebetween in the laser thermal transfer apparatus; and forming a second electrode on the intermediate layer.

The base member may have an area greater than that of the substrate.

The substrate may be disposed on the base member so that the substrate is placed within the area of the base member.

The donor film and the base member may be combined in a state that the donor film is extended by a tray, and the tray may be removed from the donor film after the combining process is completed.

The combining of the base member and the donor film may include combining a region of the base member that surrounds an edge of the substrate and the donor film.

The base member and the donor film may be combined using heat.

The base member and the donor film may be combined using an adhesive member.

The disposing of the substrate on the base member, the disposing of the donor film, and the combining of the base member and the donor film may be performed in a vacuum chamber.

The method may further include removing the base member and the donor film combined with each other with the substrate interposed therebetween to the outside of the vacuum chamber after combining the base member and the donor film.

The outside of the vacuum chamber may be in an atmospheric state.

After the base member and the donor film are combined, a region of the donor film outside of the region combined with the base member may be removed.

After the base member and the donor film are combined, a region of the base member outside of the region combined with the donor film may be removed.

The method may further include separating the base member from the substrate after forming of the intermediate layer.

According to another embodiment of the present invention, there is provided a method of manufacturing an organic light emitting display apparatus, the method including: preparing a substrate having a thin film transistor, a first electrode electrically connected to the thin film transistor, and a pixel defining film disposed to exposure a region of the first electrode; disposing the substrate on a base member; disposing a donor film to cover the substrate and to contact the base member exposed around the substrate; combining the base member with the donor film; forming an intermediate layer having an organic light emitting layer on the first region of the exposed first electrode by performing a transfer process with respect to the base member and the donor film combined with each other with the substrate interposed therebetween in a laser thermal transfer apparatus; and forming a second electrode on the intermediate layer.

The base member may have an area greater than that of the substrate.

The substrate may be disposed on the base member so that the substrate is placed within the area of the base member.

The donor film and the base member may be combined in a state that the donor film is extended by a tray and the tray may be removed from the donor film after the combining process is completed.

The combining of the base member and the donor film may include combining a region of the base member that surrounds an edge of the substrate and the donor film.

The base member and the donor film may be combined using heat.

The base member and the donor film may be combined using an adhesive member.

The disposing of the substrate on the base member, the disposing of the donor film, and the combining of the base member and the donor film may be performed in a vacuum chamber.

The method may further include removing the base member and the donor film combined with each other with the substrate interposed therebetween to the outside of the vacuum chamber after combining the base member and the donor film.

The outside of the vacuum chamber may be in an atmospheric state.

After the base member and the donor film are combined, a region of the donor film outside of the region combined with the base member may be removed.

After the base member and the donor film are combined, a region of the base member outside of the region combined with the donor film may be removed.

The method may further include separating the base member from the substrate after forming of the intermediate layer.

The method of manufacturing an organic light emitting device and the method of manufacturing an organic light emitting display apparatus may readily increase the characteristics of an intermediate layer having an organic light emitting layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

The present invention will now be described more fully with reference to the accompanying drawings in which exemplary embodiments of the invention are shown.

FIGS. 1 through 10 are cross-sectional views for sequentially illustrating a method of manufacturing an organic light emitting device, according to an embodiment of the present invention.

Figure 1:
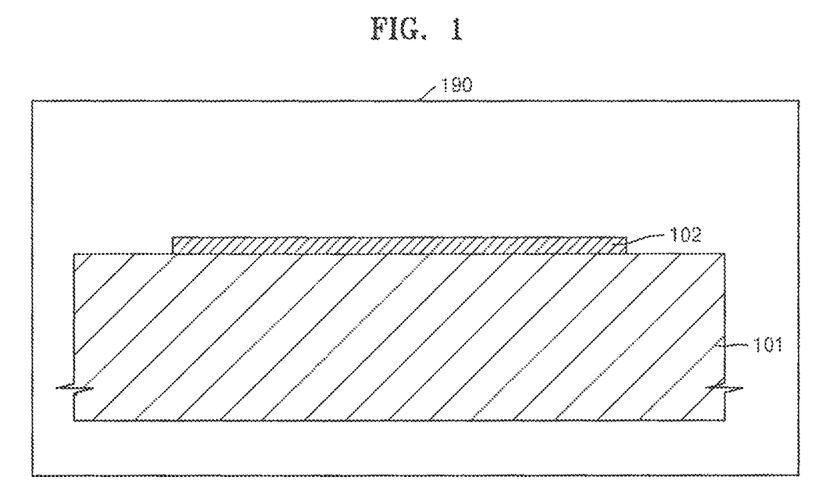
FIGS. 1 through 10 are cross-sectional views for sequentially illustrating a method of manufacturing an organic light emitting device, according to an embodiment of the present invention.

Referring to FIG. 1, a base member 102 is prepared. The base member 102 may be disposed on a work table 101. The base member 102 and the work table 101 may be disposed in a vacuum chamber 190. Although not shown, the vacuum chamber 190 may easily control the degree of vacuum to a desired level by being connected to a vacuum pump.

The base member 102 may be a flexible film type member. As a practical example, the base member 102 may be formed, e.g., of a plastic material or a glass material.

Figure 2:
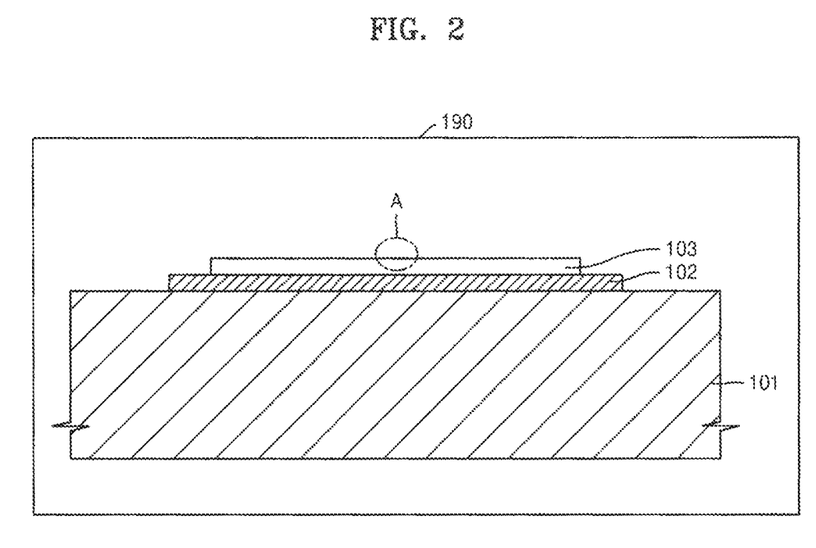
Figure 3:
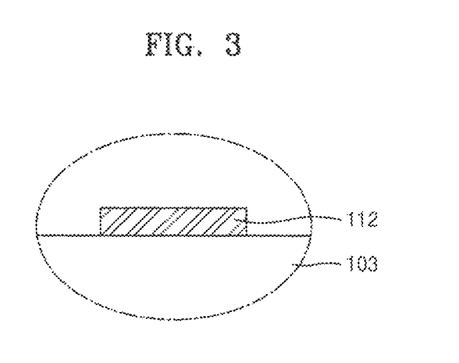

Referring to FIG. 2, a substrate 103 is disposed on the base member 102. FIG. 3 is a magnified view of portion A of FIG. 2. Referring to FIG. 3, a first electrode 112 is formed on the substrate 103. The substrate 103 has an area smaller than that of the base member 102 so that the substrate 103 can be placed within the area of the base member 102. That is, an edge (e.g., a periphery) of the substrate 103 is placed within the edges (e.g., a periphery) of the base member 102.

The substrate 103 may be formed of a glass material having $SiO_2$ as a main component. However, the substrate 103 is not limited thereto, and, for instance, may be formed of a plastic material. The plastic material for forming the substrate 103 may be an insulating organic material selected from the group consisting of polyethersulphone (PES), polyacrylate (PAR), polyetherimide (PEI), polyethyelene naphthalate (PEN), polyethylene terephthalate (PET), polyphenylene sulfide (PPS), polyarylate, polyimide, polycarbonate (PC), cellulose triacetate (TAC), cellulose acetate propionate (CAP), and combinations thereof. The substrate 103 may be formed of a metal thin film.

The first electrode 112 may be formed of various conductive materials.

Figure 4:
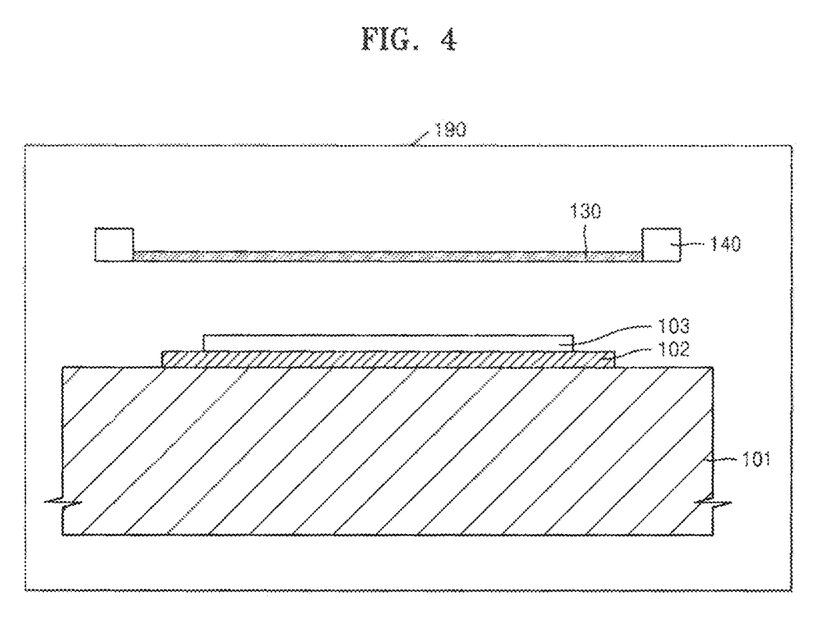

Referring to FIG. 4, a donor film 130 is prepared. Although not shown, the donor film 130 includes a transfer layer having an organic material. More specifically, the transfer layer, as a member for transferring an intermediate layer (not shown), may include a material for forming an organic light emitting layer. Also, the transfer layer of the donor film 130 may include materials for forming a hole injection layer, a hole transport layer, an electron transport layer, or an electron injection layer.

The donor film 130 may further include a base layer and an optical-heat transforming layer, besides the transfer layer.

The donor film 130 is extended using a tray 140 for aligning and stably attaching the donor film 130 to the substrate 103.

Figure 5:
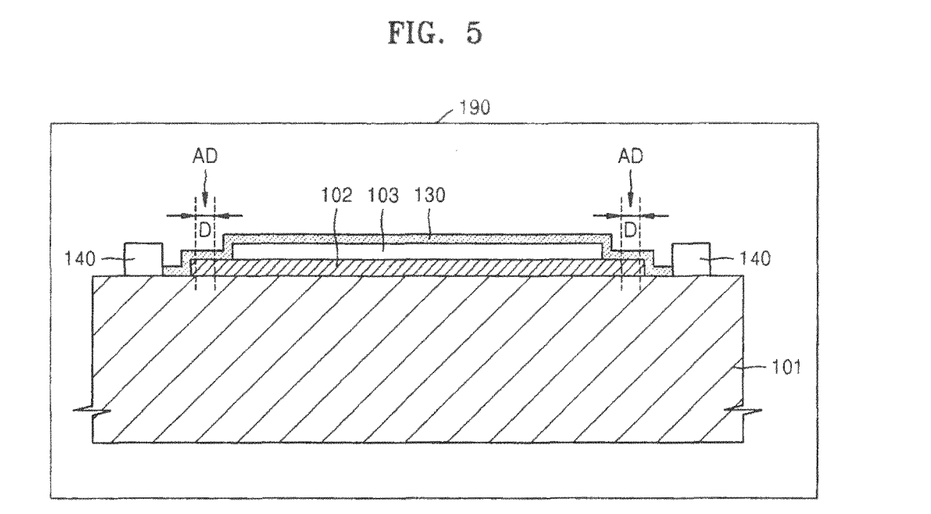

Referring to FIG. 5, the donor film 130 is disposed on the substrate 103 and the base member 102 in a state when the donor film 130 is extended by the tray 140. More specifically, the donor film 130 is disposed to cover the substrate 103 and also the base member 102 exposed around the substrate 103. Although not shown, the donor film 130 may tightly contact the substrate 103 by using a roller (not shown) after the roller is disposed on the donor film 130.

Afterwards, the donor film 130 is combined with the base member 102. More specifically, the donor film 130 is combined with the base member 102 using a combining region AD having a width D. There are various combining methods. For example, the donor film 130 and the base member 102 may be combined using heat. For instance, the donor film 130 and the base member 102 may be combined with each other by instantly melting and hardening the combining region AD by applying heat to the combining region AD. When the base member 102 is formed of a glass material, a thermal adhesive thin film may be formed in advance on a surface of the base member 102. Also, when the base member 102 is formed of a glass material, an additional adhesive member may be formed on the combining region AD.

The base member 102 and the donor film 130 are combined with each other through a combining process in which the substrate 103 is interposed therebetween.

Figure 6:
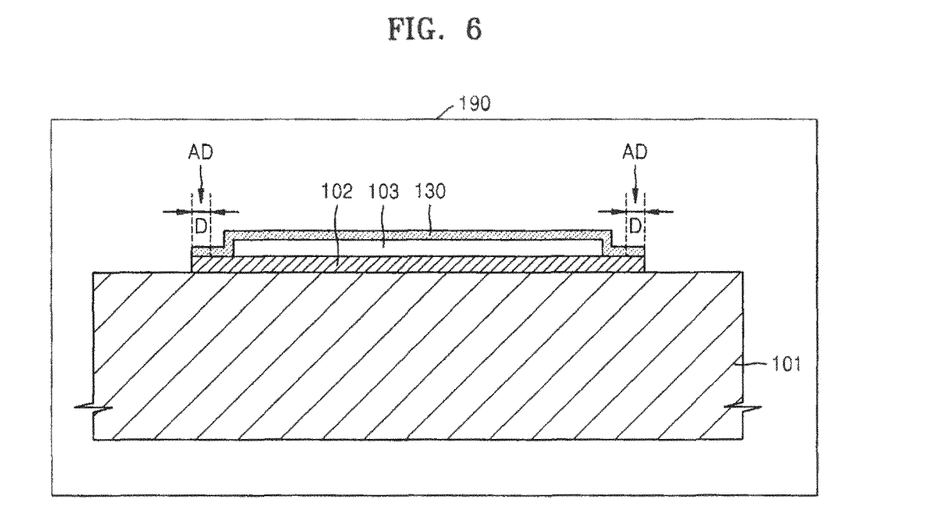

Referring to FIG. 6, the region of the donor film 130 outside of the combining region AD is removed together with the tray 140. Also, the region of the base member 102 outside of the combining region AD is removed. However, embodiments of the present invention are not limited thereto, and the region of the base member 102 outside the combining region and need not be removed.

Figure 7:
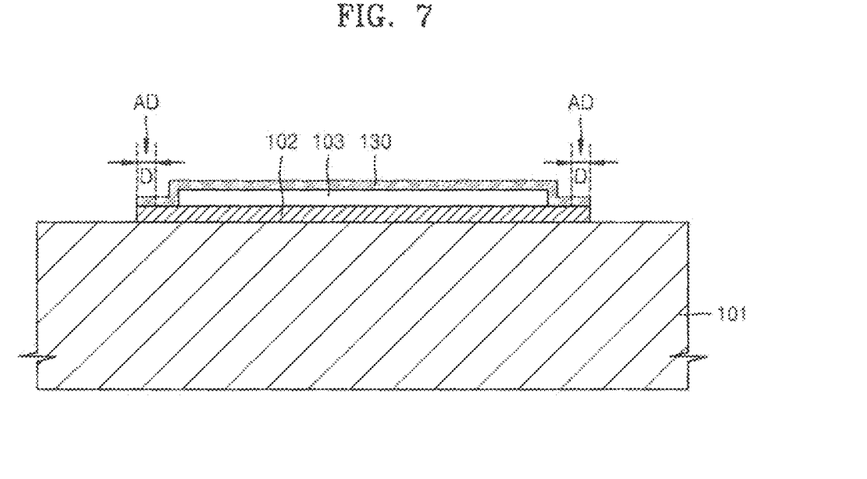

Referring to FIG. 7, the base member 102 and the donor film 130, combined with each other, and with the substrate 103 interposed therebetween, are removed from the vacuum chamber 190. Outside of the vacuum chamber 190 may be in an atmospheric state to which an additional pressure control device is not attached. In FIG. 7, a case that the work table 101 is removed from the vacuum chamber 190 is shown. However, the present invention is not limited thereto, and the base member 102 and the donor film 130 combined with each other with the substrate 103 interposed therebetween, may be removed from the vacuum chamber 190 while leaving the work table 101 in the vacuum chamber 190.

When the base member 102 and the donor film 130 combined with each other with the substrate 103 interposed therebetween are removed from the vacuum chamber 190, the donor film 130 and the substrate 103 may tightly contact each other due to an instant pressure change.

Figure 8:
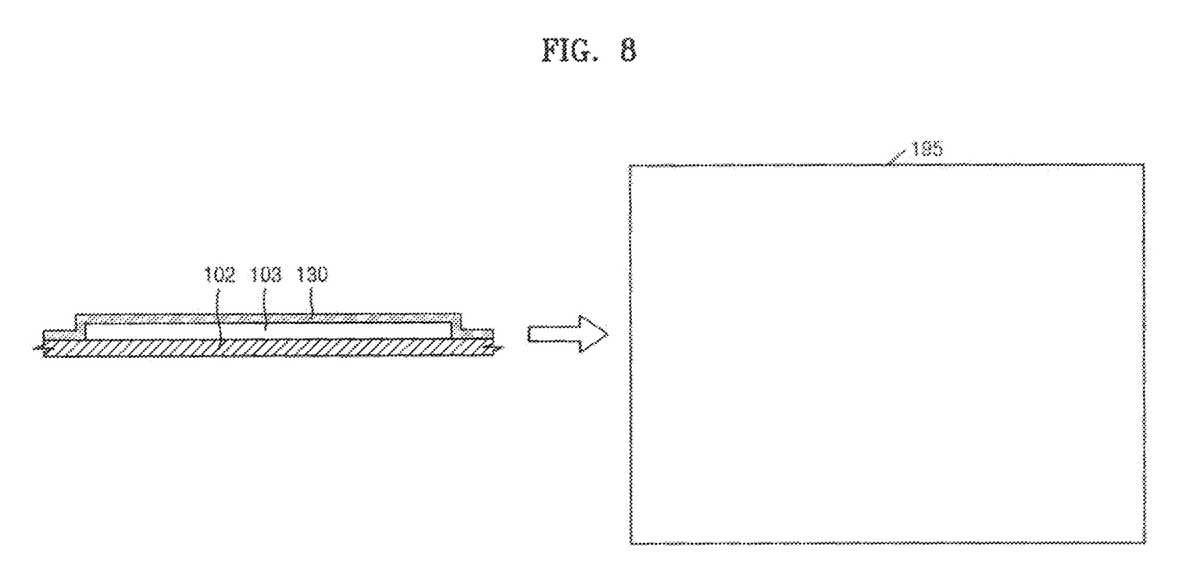

Referring to FIG. 8, the base member 102 and the donor film 130, combined with each other with the substrate 103 interposed therebetween are put into a laser thermal transfer apparatus 195. The laser thermal transfer apparatus 195 includes a laser optical source for irradiating a laser that generates an amount of heat (e.g., predetermined amount of heat). The transfer layer of the donor film 130 is transferred onto the first electrode 112 using the laser thermal transfer apparatus 195.

Figure 9:
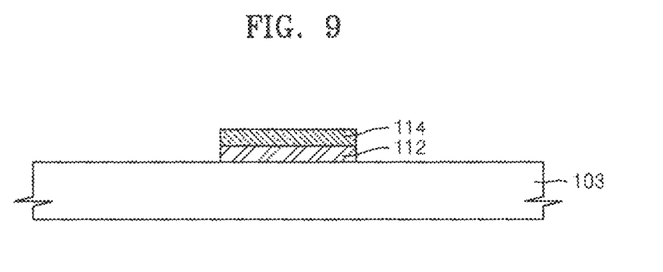

Referring to FIG. 9, an intermediate layer 114 having an organic light emitting layer is formed on the first electrode 112 after the transfer process is completed using the laser thermal transfer apparatus 195. Although not shown, the base member 102 is separated from the substrate 103 when the intermediate layer 114 is formed by a transfer process.

Figure 10:
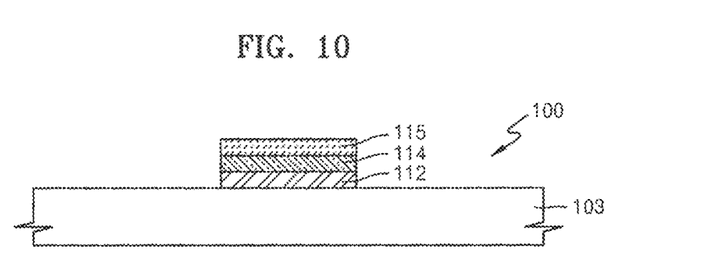

Referring to FIG. 10, a second electrode 115 is formed on the intermediate layer 114. The second electrode 115 may be formed of various conductive materials. When the second electrode 115 is formed, an organic light emitting device 100 is finally formed.

According to one embodiment of the present invention, when the substrate 103 and the donor film 130 are tightly combined with each other, the base member 102 is used. After disposing the substrate 103 on the base member 102 having an area greater than that of the substrate 103, the base member 102 and the donor film 130 are combined by using a combining method, such as a thermal combining method, in the vacuum chamber 190. After performing the thermal combining process, the tray 140 is removed from the donor film 130. In this way, since the base member 102 and the donor film 130 combined with each other with the substrate 103 interposed therebetween are placed in the laser thermal transfer apparatus 195 without the tray 140, the transfer process may be performed without limiting the size of the laser thermal transfer apparatus 195. Due to the easiness of the transfer process, the intermediate layer 114 of the organic light emitting device 100 may be formed in a desired pattern without a product failure or reduction in occurrence of a product failure.

Also, the base member 102 and the donor film 130 are combined with each other with the substrate 103 interposed therebetween in the vacuum chamber 190, and are removed from the vacuum chamber 190. Therefore, the adhesion between the donor film 130 and the base member 102 is increased, and thus, the transfer process may be easily performed and the characteristics of the intermediate layer 114 may be improved.

Also, since the base member 102 and the donor film 130 are combined with each other with the substrate 103 interposed therebetween in the vacuum chamber 190, and are removed from the vacuum chamber 190, a combined body (e.g., a completely combined body) of the substrate 103, the donor film 130, and the base member 102 may be easily and freely transported to a process place and a process apparatus.

FIGS. 11 through 17 are cross-sectional views for sequentially illustrating a method of manufacturing an organic light emitting display apparatus, according to another embodiment of the present invention. For convenience of explanation, only differences from the previous embodiment will be described.

Figure 11:
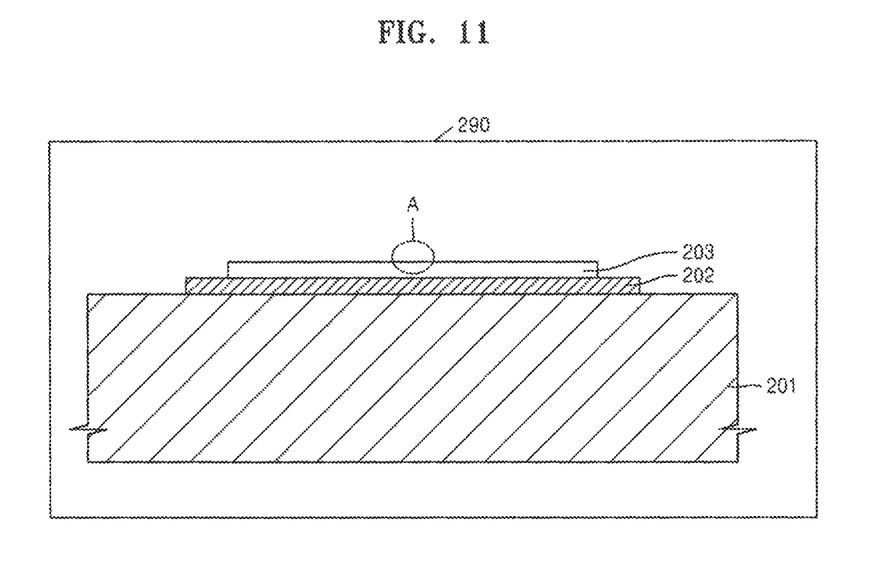
FIGS. 11 through 17 are cross-sectional views for sequentially illustrating a method of manufacturing an organic light emitting display apparatus, according to an embodiment of the present invention.

Referring to FIG. 11, a base member 202 is disposed on a work table 201 and a substrate 203 is disposed on the base member 202. The base member 202, the work table 201, and the substrate 203 are placed in a vacuum chamber 290.

The substrate 203 has an area smaller than that of the base member 202 so that the substrate 203 can be placed within the area of the base member 202. That is, an edge (e.g., a periphery) of the substrate 203 is placed within an edge (e.g., a periphery) of the base member 202.

Figure 12:
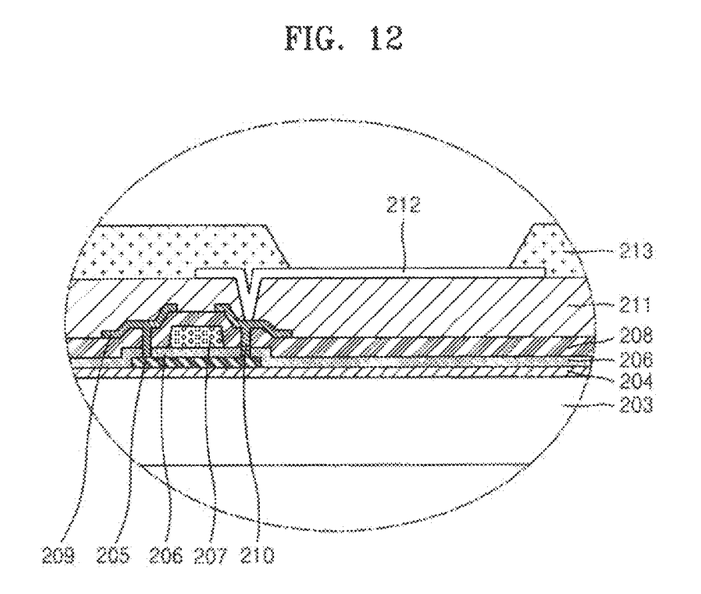

FIG. 12 is a magnified view of the portion A of FIG. 11. Referring to FIG. 12, a thin film transistor, a first electrode 212, and a pixel defining film 213 are formed on the substrate 203. The thin film transistor includes an active layer 205, a gate electrode 207, a source electrode 209, and a drain electrode 210.

More specifically, a buffer layer 204 is formed on the substrate 203. The buffer layer 204 provides a flat surface on the substrate 203 and prevents moisture and foreign materials from penetrating in a direction towards the substrate 203.

The active layer 205, having a pattern (e.g., a predetermined pattern), is formed on the buffer layer 204. The active layer 205 may be formed of an inorganic semiconductor or an organic semiconductor, such as amorphous silicon or polysilicon, and includes a source region, a drain region, and a channel region. A gate insulating film 206 is formed on the active layer 205, and the gate electrode 207 is formed on a region (e.g., a predetermined region) of the gate insulating film 206. The gate electrode 207 is connected to a gate line (not shown). The gate electrode 207 may be formed of a material selected from the group consisting of Au, Ag, Cu, Ni, Pt, Pd, Al, Mo, combinations thereof, or an alloy of Al:Nd or Mo:W, but is not limited thereto.

An interlayer insulating film 208 is formed on the gate electrode 207, and exposes the source region and the drain region of the active layer 205. Afterwards, a source electrode 209 and a drain electrode 210 are formed to respectively contact the source region and the drain region of the active layer 205.

A passivation film 211, covering the source electrode 209, the drain electrode 210, and the interlayer insulating film 208, is formed.

The first electrode 212 is formed on the passivation film 211. The passivation film 211 is formed exposing the drain electrode 210 there through, and the first electrode 212 is connected to the exposed drain electrode 210.

The pixel defining film 213 is formed on the first electrode 212. The pixel defining film 213 may be formed of various insulating materials, and a region (e.g., a predetermined region) of the first electrode 212 may be exposed there through.

Figure 13:
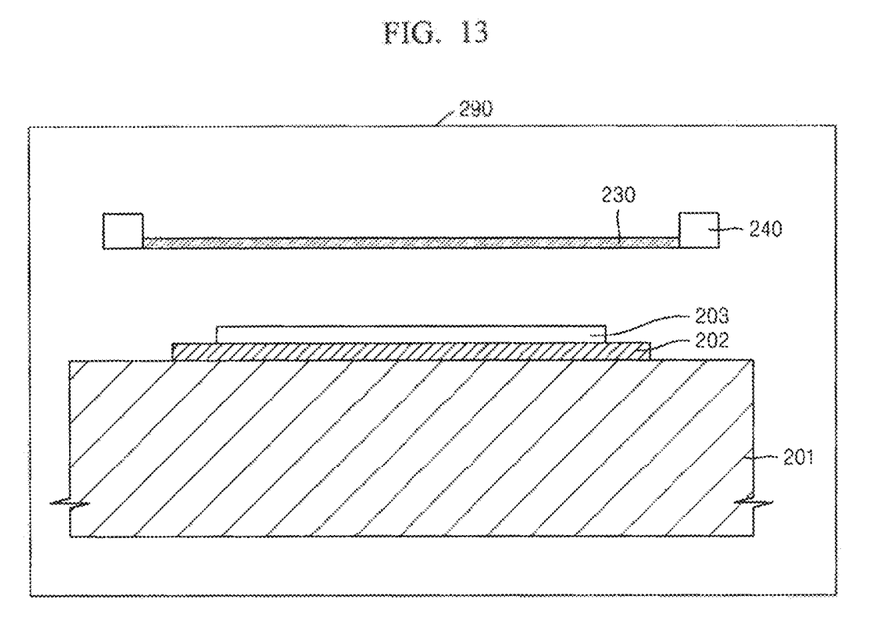

Referring to FIG. 13, a donor film 230 is prepared. The donor film 230 is extended using a tray 240.

Figure 14:
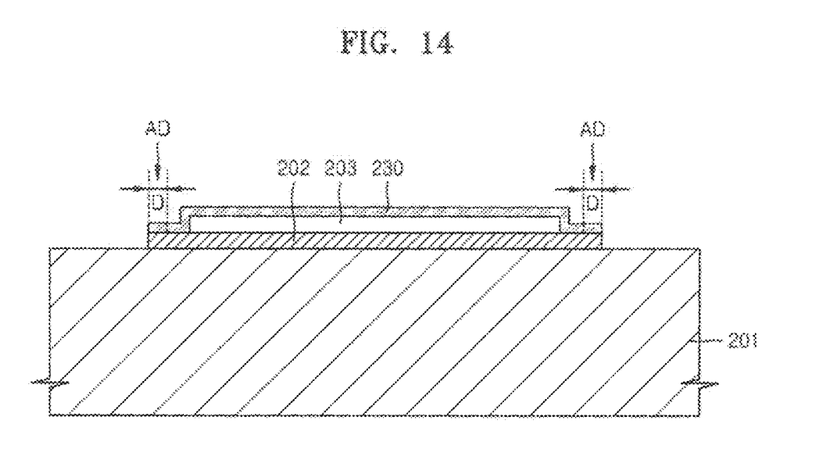

Referring to FIG. 14, the donor film 230 is combined with the base member 202. More specifically, the donor film 230 is combined with the base member 202 using a combining region AD having a width D. Although not shown, the donor film 230 is disposed on the substrate 203 and the base member 202 while the donor film 230 is extended by the tray 240.

Also, the donor film 230 is combined with the base member 202 using a combining region AD having a width D. After combining the base member 202 with the donor film 230 with the substrate 203 interposed therebetween through a combining process, the region of the donor film 230 outside of the combining region AD is removed. At this point, the tray 240 is also removed. Also, the region of the base member 202 outside of the combining region AD is removed. However, the present invention is not limited thereto, and the region of the base member 202 need not be removed in other embodiments. Afterwards, the base member 202 and the donor film 230 combined with each other with the substrate 203 interposed therebetween are removed from the vacuum chamber 290. Outside of the vacuum chamber 290 may be in an atmospheric state to which an additional pressure control device is not attached. In FIG. 14, it is depicted that the work table 201 is removed from the vacuum chamber 290. However, the present invention is not limited thereto, and the base member 202 and the donor film 230 combined with each other with the substrate 203 interposed therebetween may be removed from the vacuum chamber 290 while leaving the work table 201 in the vacuum chamber 290.

When the base member 202 and the donor film 230 combined with each other with the substrate 203 interposed therebetween are removed from the vacuum chamber 290, the donor film 230 and the substrate 203 may tightly contact each other due to an instant pressure change.

Figure 15:
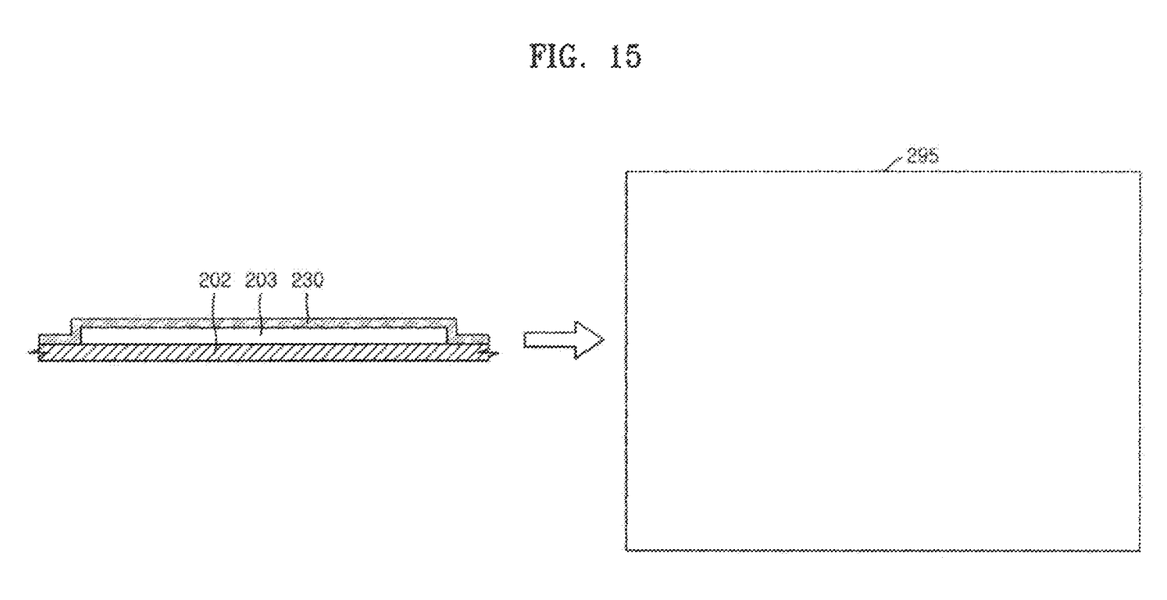

Referring to FIG. 15, the base member 202 and the donor film 230 combined with each other with the substrate 203 interposed therebetween are put into a laser thermal transfer apparatus 295. A transfer layer of the donor film 230 is transferred onto the first electrode 212 by using the laser thermal transfer apparatus 295.

Figure 16:
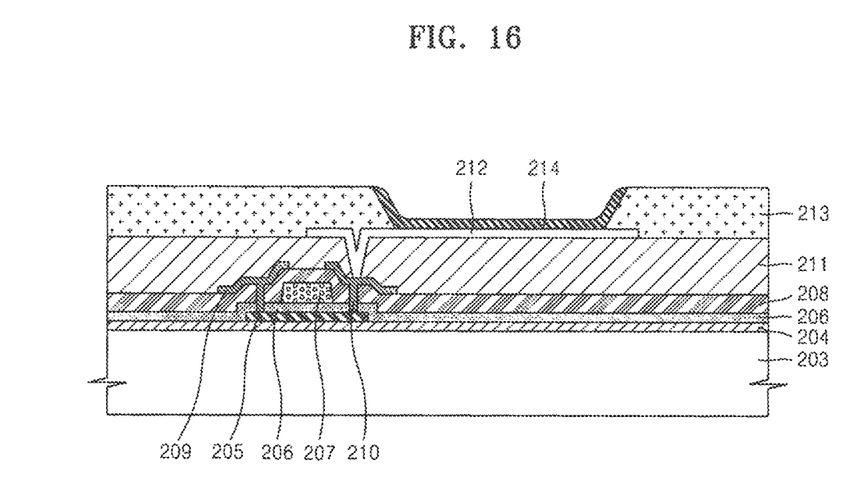

Referring to FIG. 16, after the transfer process using the laser thermal transfer apparatus 295 is completed, an intermediate layer 214 having an organic light emitting layer is formed on the first electrode 212. More specifically, the intermediate layer 214 is formed to contact an exposed region of the first electrode 212 which is not covered by the pixel defining film 213.

Although not shown, the base member 202 is separated from the substrate 203 when the intermediate layer 214 is formed by the transfer process.

Figure 17:
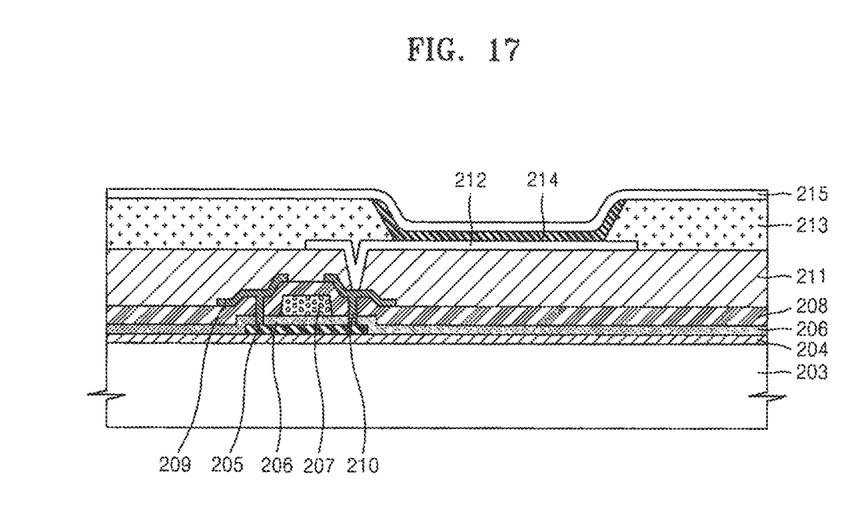

Referring to FIG. 17, a second electrode 215 is formed on the intermediate layer 214. The second electrode 215 may be formed of various conductive materials. When the second electrode 215 is formed, the manufacture of an organic light emitting display apparatus 200 is finally completed.

In an embodiment of the present invention, when the substrate 203 and the donor film 230 are combined, the base member 202 disposed under the substrate 203 is used. For example, after disposing the substrate 203 on the base member 202 having an area greater than that of the substrate 203, the base member 202 and the donor film 230 are combined using a combining method, such as a thermal combining method, in the vacuum chamber 290. After performing the thermal combining process, the tray 240 is removed from the donor film 230. In this way, since the base member 202 and the donor film 230 combined with each other with the substrate 203 interposed therebetween are placed in the laser thermal transfer apparatus 295 without the tray 240, the transfer process may be performed without limiting the size of the laser thermal transfer apparatus 295. Due to the easiness of the transfer process, the intermediate layer 214 of the organic light emitting device 200 may be formed in a desired pattern without a product failure or reduction in occurrence of a product failure.

Also, in the current embodiment of the present invention, the base member 202 and the donor film 230 are combined with each other with the substrate 203 interposed therebetween in the vacuum chamber 290, and are removed from the vacuum chamber 290. Therefore, the adhesion between the donor film 230 and the base member 202 is increased, and thus, the transfer process may be easily performed, and the characteristics of the intermediate layer 214 may be improved.

Also, since the base member 202 and the donor film 230 are combined with each other with the substrate 203 interposed therebetween in the vacuum chamber 290, and are removed from the vacuum chamber 290, a combined body (e.g., a completely combining body) of the substrate 203, the donor film 230, and the base member 202 may be easily and freely transported to a process place and a process apparatus While the present invention has been particularly shown and described with reference to exemplary embodiments thereof, it will be understood by one of ordinary skill in the art that various changes in form and details may be made therein without departing from the spirit and scope of the present invention as defined by the following claims, and their equivalents.

What is claimed is:

1. A method of manufacturing an organic fight emitting device, the method comprising:
   preparing a substrate having a first electrode;
   disposing the substrate on a base member;
   disposing a donor film that covers the substrate and contacts the base member exposed around the substrate;
   combining the base member and the donor film;
   forming an intermediate layer having an organic light emitting layer on the first electrode by performing a transfer process in a laser thermal transfer apparatus after placing the base member and the donor film combined with each other with the substrate interposed therebetween in the laser thermal transfer apparatus; and
   forming a second electrode on the intermediate layer.

2. The method of claim 1, wherein the base member has an area greater than that of the substrate.

3. The method of claim 1, wherein the substrate is disposed on the base member, wherein the substrate is placed within the area of the base member.

4. The method of claim 1, wherein the donor film and the base member are combined in a state that the donor film is extended by a tray, and the tray is removed from the donor film after the combining process is completed.

5. The method of claim 1, wherein the combining of the base member and the donor film comprises combining a region of the base member that surrounds a periphery of the substrate and the donor film.

6. The method of claim 1, wherein the base member and the donor film are combined using heat.

7. The method of claim 1, wherein the base member and the donor film are combined using an adhesive member.

8. The method of claim 1, wherein the disposing of the substrate on the base member, the disposing of the donor film, and the combining of the base member and the donor film are performed in a vacuum chamber.

9. The method of claim 8, further comprising removing the base member and the donor film combined with each other with the substrate interposed therebetween to the outside of the vacuum chamber after combining the base member and the donor film.

10. The method of claim 9, wherein the outside of the vacuum chamber is in an atmospheric state.

11. The method of claim 1, wherein, after the base member and the donor film are combined, a second region of the donor film outside of a first region combined with the base member is removed.

12. The method of claim 1, wherein, after the base member and the donor film are combined, a second region of the base member outside of a first region combined with the donor film is removed.

13. The method of claim 1, further comprising separating the base member from the substrate after forming of the intermediate layer.

14. A method of manufacturing an organic light emitting display apparatus, the method comprising:
preparing a substrate having a thin film transistor, a first electrode electrically connected to the thin film transistor, and a pixel defining film disposed to expose a region of the first electrode;
disposing the substrate on a base member;
disposing a donor film to cover the substrate and to contact the base member exposed around the substrate;
combining the base member with the donor film;
forming an intermediate layer having an organic light emitting layer on the region of the first electrode by performing a transfer process with respect to the base member and the donor film combined with each other with the substrate interposed therebetween in a laser thermal transfer apparatus; and
forming a second electrode on the intermediate layer.

15. The method of claim 14, wherein the base member has an area greater than that of the substrate.

16. The method of claim 14, wherein the substrate is disposed on the base member so that the substrate is placed within an area of the base member.

17. The method of claim 14, wherein the donor film and the base member are combined in a state that the donor film is extended by a tray, and the tray is removed from the donor film after the combining process is completed.

18. The method of claim 14, wherein the combining of the base member and the donor film comprises combining a region of the base member that surrounds a periphery of the substrate and the donor film.

19. The method of claim 14, wherein the base member and the donor film are combined using heat.

20. The method of claim 14, wherein the base member and the donor film are combined using an adhesive member.

21. The method of claim 14, wherein the disposing of the substrate on the base member, the disposing of the donor film, and the combining of the base member and the donor film are performed in a vacuum chamber.

22. The method of claim 21, further comprising removing the base member and the donor film combined with each other with the substrate interposed therebetween to the outside of the vacuum chamber after combining the base member and the donor film.

23. The method of claim 21, wherein the outside of the vacuum chamber is in an atmospheric state.

24. The method of claim 14, wherein, after the base member and the donor film are combined, a region of the donor film outside of the region combined with the base member is removed.

25. The method of claim 14, wherein, after the base member and the donor film are combined, a region of the base member outside of the region combined with the donor film is removed.

26. The method of claim 14, further comprising separating the base member from the substrate after forming of the intermediate layer.

* * * * *

UNITED STATES PATENT AND TRADEMARK OFFICE
CERTIFICATE OF CORRECTION

PATENT NO.        : 8,435,817 B2
APPLICATION NO.   : 13/267643
DATED             : May 7, 2013
INVENTOR(S)       : Jin-Han Park Page 1 of 1

It is certified that error appears in the above-identified patent and that said Letters Patent is hereby corrected as shown below:

In the Claims

Column 8, Claim 1, line 26        Delete "fight"

Insert -- light --

Signed and Sealed this
Eighth Day of July, 2014

Michelle K. Lee
*Deputy Director of the United States Patent and Trademark Office*